United States Patent
Chen

(10) Patent No.: US 11,482,663 B2
(45) Date of Patent: Oct. 25, 2022

(54) MICROELECTROMECHANICAL SYSTEM WITH PIEZOELECTRIC FILM AND MANUFACTURING METHOD THEREOF

(71) Applicant: TAIWAN SEMICONDUCTOR MANUFACTURING CO., LTD., Hsinchu (TW)

(72) Inventor: Ting-Jung Chen, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 281 days.

(21) Appl. No.: 16/879,565

(22) Filed: May 20, 2020

(65) Prior Publication Data

US 2020/0411749 A1    Dec. 31, 2020

Related U.S. Application Data

(60) Provisional application No. 62/868,638, filed on Jun. 28, 2019.

(51) Int. Cl.
| | |
|---|---|
| H01L 41/293 | (2013.01) |
| H01L 41/047 | (2006.01) |
| H01L 41/083 | (2006.01) |
| H01L 41/35 | (2013.01) |

(52) U.S. Cl.
CPC ........ *H01L 41/293* (2013.01); *H01L 41/0472* (2013.01); *H01L 41/083* (2013.01); *H01L 41/35* (2013.01)

(58) Field of Classification Search
CPC . H01L 41/293; H01L 41/0472; H01L 41/083; H01L 41/35
See application file for complete search history.

(56) References Cited

U.S. PATENT DOCUMENTS

| | | | |
|---|---|---|---|
| 9,067,779 B1 | 6/2015 | Rothberg et al. | |
| 2005/0231074 A1* | 10/2005 | Iwase | H01L 41/293 310/328 |
| 2011/0116171 A1* | 5/2011 | Kwon | H01L 41/0474 29/25.35 |
| 2014/0269530 A1 | 9/2014 | Hussain et al. | |
| 2014/0352440 A1 | 12/2014 | Fennell et al. | |
| 2015/0325781 A1* | 11/2015 | Rinner | H01L 41/083 29/25.35 |
| 2019/0067353 A1 | 2/2019 | Tsao et al. | |

FOREIGN PATENT DOCUMENTS

| | | |
|---|---|---|
| CN | 103843370 B | 12/2017 |
| CN | 107755365 A | 3/2018 |
| TW | 201447341 A1 | 12/2014 |
| TW | 201913989 A1 | 4/2019 |

* cited by examiner

*Primary Examiner* — Matthew L Reames
(74) *Attorney, Agent, or Firm* — Maschoff Brennan

(57) ABSTRACT

A method for forming a MEMS device is provided. The method includes forming a stack of piezoelectric films and metal films on a base layer, wherein the piezoelectric films and the metal films are arranged in an alternating manner. The method also includes forming a first trench in the stack of the piezoelectric films and the metal films. The method further includes forming at least one void at the side wall of the first trench. In addition, the method includes forming a spacer structure in the at least one void. The method further includes forming a contact in the first trench after the formation of the spacer structure.

20 Claims, 15 Drawing Sheets

MICROELECTROMECHANICAL SYSTEM WITH PIEZOELECTRIC FILM AND MANUFACTURING METHOD THEREOF

PRIORITY CLAIM AND CROSS-REFERENCE

This application claims the benefit of U.S. Provisional Application No. 62/868,638, filed on Jun. 28, 2019, the entirety of which is incorporated by reference herein.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device design are needed.

Concurrent with advances in functional density, developments in micro-electromechanical systems (MEMS) devices have led to entirely new devices and structures at sizes far below what was previously attainable. MEMS devices are the technology of forming micro-structures with mechanical and electronic features. The MEMS device may comprise a plurality of elements (e.g., movable elements) for achieving mechanical functionality. In addition, the MEMS device may comprise a variety of sensors that sense various mechanical signals such as pressure, inertial forces and the like, and convert the mechanical signals into their corresponding electrical signals.

MEMS applications include motion sensors, pressure sensors, printer nozzles and the like. Other MEMS applications include inertial sensors such as accelerometers for measuring linear acceleration and gyroscopes for measuring angular velocity. Moreover, MEMS applications may extend to sound applications such as micro machined ultrasound transducers and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
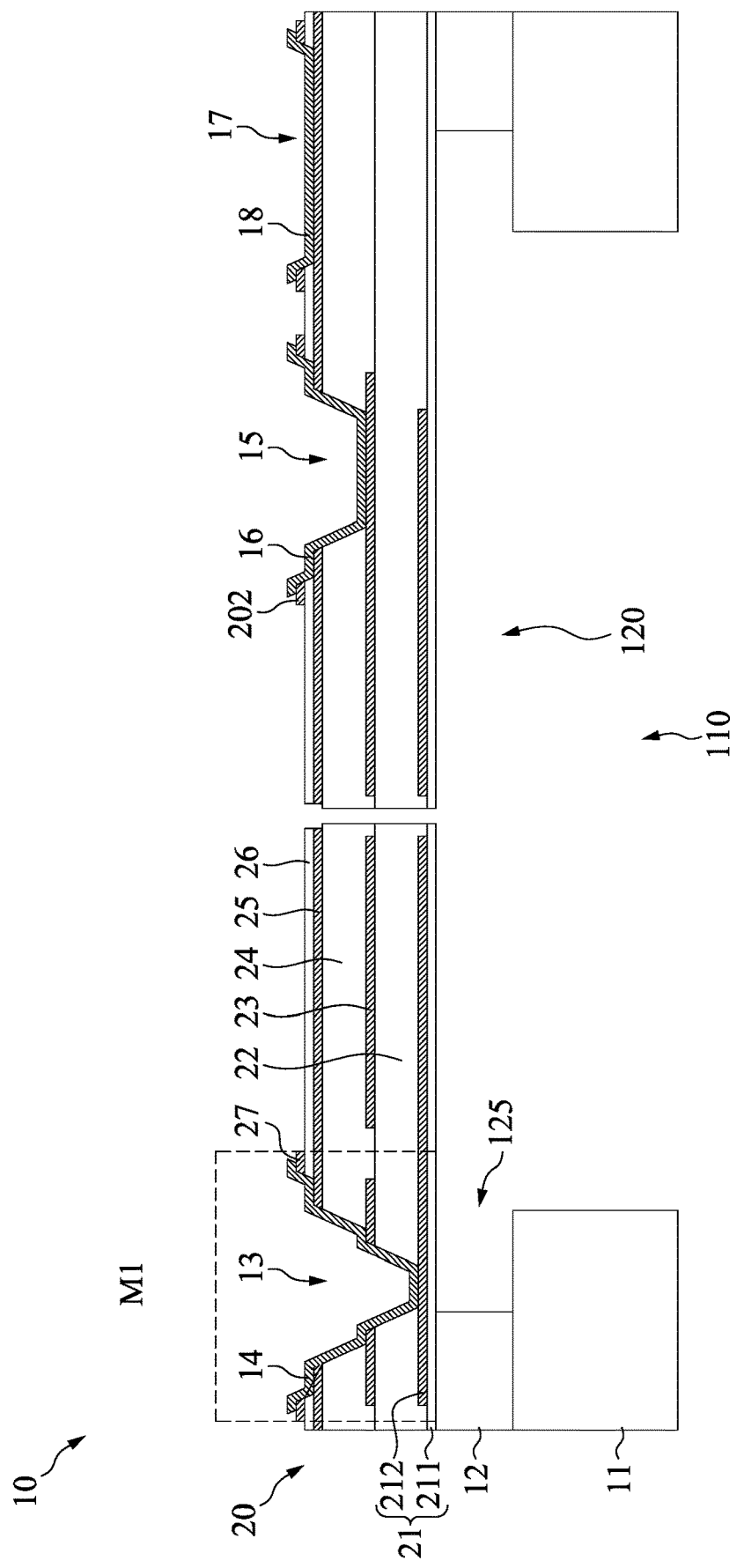
FIG. 1 is a cross-sectional view of a MEMS device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first projection over or on a second projection in the description that follows may include embodiments in which the first and second projections are formed in direct contact, and may also include embodiments in which additional features may be formed between the first and second projections, such that the first and second projections may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One application of microelectromechanical systems (MEMS) devices is sound application device. In the sound application device, a membrane is positioned relative to a cavity. Contact is formed in a trench of the membrane for electrical connection between the MEMS device and other circuit, e.g. mother board of an electronic apparatus, and signals in relation to the curvature of the membrane is transmitted to or from the circuit through the contact. An uneven sidewall of the trench may cause a broken of the contact line and adversely effects the transmission of the signals. Embodiments of present disclosure provide a MEMS device with a trench having a spacer structure formed therein to prevent the contact from being broken due to uneven side wall of the trench.

FIG. 1 is a cross-sectional view of a MEMS device 10, in accordance with some embodiments of the present disclosure. In some embodiments, the MEMS device 10 includes a substrate layer 11, a supporting layer 12, a number of contacts, such as contacts 14, 16 and 18, and a flexible layer 20.

The substrate layer 11 may include a silicon substrate in crystalline structure and/or other elementary semiconductors like germanium having a thickness ranging from about 250 micrometers to about 500 micrometers. Alternatively or additionally, the substrate layer 11 may include a compound semiconductor such as silicon carbide, gallium arsenide, indium arsenide, and/or indium phosphide. The supporting layer 12 is disposed on the substrate layer 11. In example embodiments, the supporting layer 12 includes an oxide layer, e.g., thermal or chemical oxide having a thickness ranging from about 0.5 micrometers to about 1 micrometer.

In some embodiments, an opening 110 is formed in the substrate layer 11, and an opening 120 is formed in the supporting layer 12. In some embodiments, the opening 120 has a wider width than a width of the opening 110 and may be centrally aligned with the opening 110, and a space 125 may be formed between the flexible layer 20 and the substrate layer 11. The width of the opening 120 depends on the device design as long as the space 125 permits a bending movement of the flexible layer 20 toward the opening 120. In cases where the MEMS device 10 is used for sound application, the openings 110 and 120 are formed to allow the transmission of sound waves.

The flexible layer 20 is used to detect a physical wave and produce corresponding signals based on the detected physical wave by piezoelectric effect. In some embodiments, the flexible layer 20 includes a base layer 21 and a stack of piezoelectric films and metal films with the piezoelectric films and the metal films being arranged in an alternating manner.

The base layer 21 includes a base piezoelectric film 211 and a base metal film 212. The base piezoelectric film 211 is formed on the supporting layer 12. The base piezoelectric film 211 may be or comprise, for example, aluminium nitride (AlN) films and the like and has a thickness that is in a range from about 100 Å (angstrom) to about 500 Å. The MN films with crystal orientation may be used in resonator-based applications such as bulk acoustic wave (BAW) and film bulk acoustic resonators (FBAR) filters, oscillators and resonating sensors. The base piezoelectric film 211 may, for example, be formed by chemical vapor deposition (CVD), physical vapor deposition (PVD) or the like.

The base metal film 212 is formed on a side of the base piezoelectric film 211 that is away from the supporting layer 12. The base metal film 212 may be or comprise, for example, molybdenum (Mo) and the like and has a thickness that is in a range from about 100 Å to about 500 Å. The base metal film 212 is formed overlying the base piezoelectric film 211 using suitable deposition techniques, such as atomic layer deposition (ALD), chemical vapor deposition (CVD), physical vapor deposition (PVD) or the like, and the base metal film 212 is patterned according to circuit design of the MEMS device 10 using suitable photolithography techniques.

The stack of the piezoelectric films and the metal films is formed on the base layer 21. In the present embodiment, there are three piezoelectric films, such as piezoelectric films 22, 24 and 26, and three metal films, such as metal films 23, 25 and 27, are stacked on the base layer 21. However, the number of piezoelectric films and the metal films in FIG. 1 is given for illustrative purpose, and the MEMS device 10 can include any number of piezoelectric films and metal films.

In some embodiments, multiple trenches, such as trenches 13, 15 and 17 are formed on the stack of the piezoelectric films and the metal films so as to expose the metal films on different levels. In some embodiments, each of the trenches 13, 15 and 17 has different depth relative to a top surface 202 of the flexible layer 20. For example, the trench 13 passes through the piezoelectric films 24 and 26 and the metal films 23 and 25 and extends into the piezoelectric film 22 to expose the base metal film 212 of the base layer 21. In addition, the trench 15 passes through the piezoelectric film 26 and the metal film 25 and extends into the piezoelectric film 24 to expose the metal film 23. Moreover, the trench 17 extends into the piezoelectric film 26 to expose the underlying metal film 25. In some embodiments, no trench formed in the base layer 21, and all the trenches are formed above the base layer 21. In some embodiments, the depth of one of the trenches which has the largest depth (e.g., trench 13) is equal to a distance between the top surface 202 and the base metal film 212.

Figure 2:
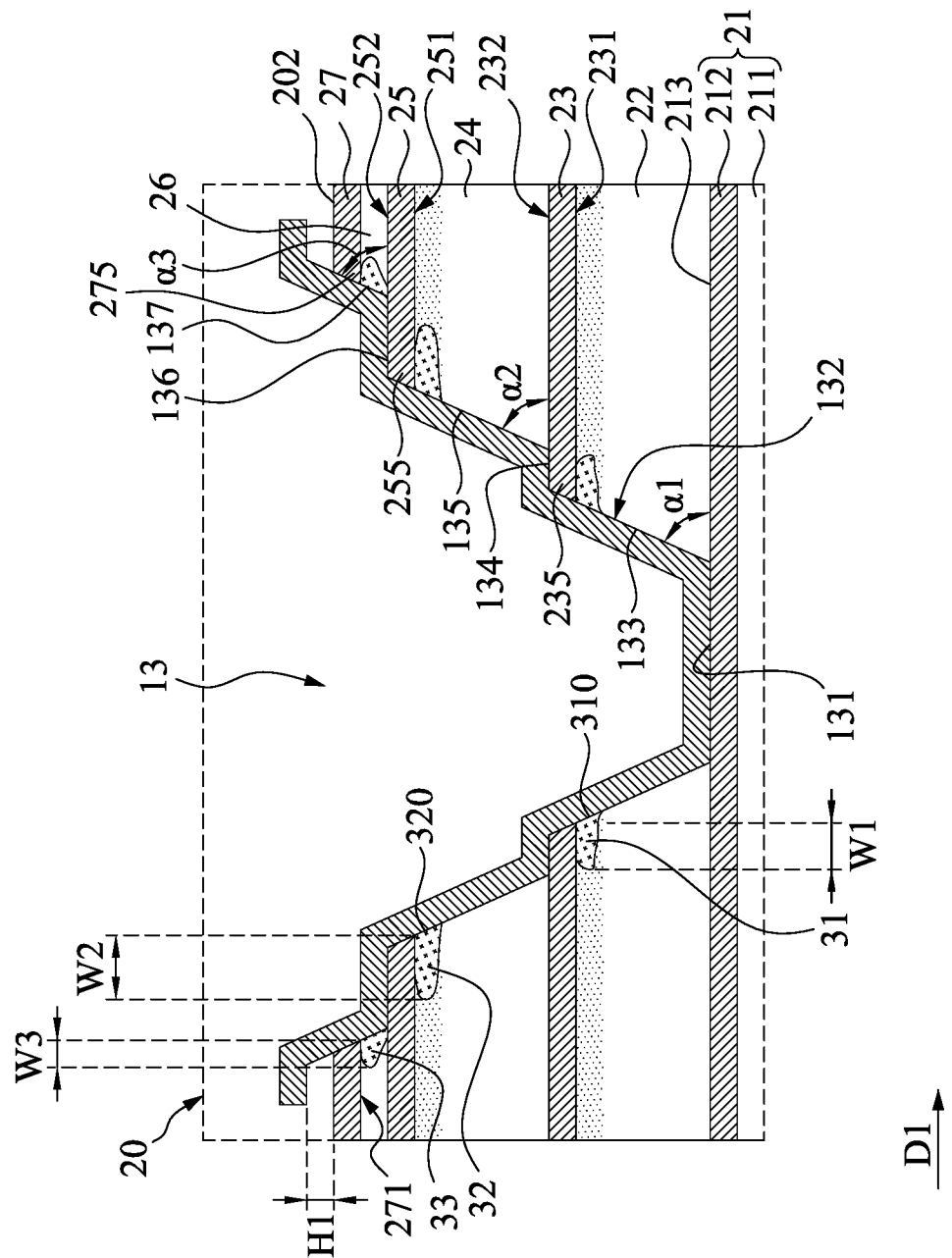
FIG. 2 is a magnified cross-sectional view of an area M1 of the MEMS device shown in FIG. 1, in accordance with some embodiments of the present disclosure.

FIG. 2 is a magnified cross-sectional view of an area M1 of the MEMS device shown in FIG. 1, in accordance with some embodiments of the present disclosure. In some embodiments, as shown in FIG. 2, the trench 13 has a bottom wall 131 and a slopped side wall 132. The slopped side wall 132 surrounds the bottom wall 131 and connects the bottom wall 131 to the top surface 202 of the flexible layer 20. In some embodiments, the slopped side wall 132 has a step structure and includes a first slopped segment 133, a first connecting segment 134, a second slopped segment 135, a second connecting segment 136, and a third slopped segment 137.

The first slopped segment 133 is connected to the bottom wall 131 and is constructed by a side wall of the piezoelectric film 22 and a side wall of the metal film 23. The first connecting segment 134 connects the first slopped segment 133 to the second slopped segment 135 and is constructed by a portion of a top surface 232 of the metal film 23 that is not covered by the piezoelectric film 24. The second slopped segment 135 is constructed by a side wall of the piezoelectric film 24 and a side wall of the metal film 25. The second connecting segment 136 connects the second slopped segment 135 to the third slopped segment 137 and is constructed by a portion of a top surface 252 of the metal film 25 that is not covered by the piezoelectric film 26. The third slopped segment 137 is connected to the top surface 202 of the flexible layer 20 and is constructed by a side wall of the piezoelectric film 26 and a side wall of the metal film 27.

In some embodiments, the piezoelectric films of the flexible layer 20 have different slopped angles. For example, as shown in FIG. 2, a slopped angle $\alpha 2$ between the second slopped segment 135 and a top surface 232 of the metal film 23 is greater than a slopped angle $\alpha 1$ between the first slopped segment 133 and the top surface 213 of the base layer 21. In addition, a slopped angle $\alpha 3$ between the third slopped segment 137 and the top surface 252 of the metal film 25 is greater than the slopped angle $\alpha 2$ between the second slopped segment 135 and the top surface 232 of the metal film 23. However, it will be appreciated that many variations and modifications can be made to embodiments of the disclosure. The slopped angles $\alpha 1$, $\alpha 2$ and $\alpha 3$ may be within a range between about 5 degrees to about 89 degrees. Any slopped angles are possible as long as the slopped angles are known and controlled.

In some embodiments, a bottom surface of at least one of metal films 23, 25 and 27 of the flexible layer 20 is not entirely covered by the underlying piezoelectric films 22, 24 and 26, and the bottom surface of one of the metal films 23, 25 and 27 exposed by the underlying piezoelectric films 22, 24 and 26 is covered by a spacer structure instead. For example, as shown in FIG. 2, the metal films 23, 25 and 27 have distal portions 235, 255 and 275 located adjacent to the slopped side wall 132 of the trench 13. A bottom surface 231 of the metal film 23 corresponding to the distal portion 235 of the metal film 23 is not entirely covered by the piezoelectric film 22 and is supported by a spacer structure 31. In addition, a bottom surface 251 of the metal film 25 corresponding to the distal portion 255 of the metal film 25 is not entirely covered by the piezoelectric film 24 and is supported by a spacer structure 32. Moreover, a bottom surface 271 of the metal film 27 corresponding to the distal portion 275 of the metal film 27 is not entirely covered by the piezoelectric film 26 and is supported by a spacer structure 33. In the present disclosure, the distal portion of the metal film is defined as a portion of the metal film with a bottom surface that is free from contact with the piezoelectric film and is in direct contact with the spacer structure.

In some embodiments, at least two of distal portions 235, 255 and 275 have different extension lengths in a direction that is parallel to the extension direction of the base layer 21. For example, as shown in FIG. 2, the distal portion 235 has an extension length W1 in a direction D1 along which the base layer 21 extends, and the distal portion 255 has an extension length W2 in the direction D1. The distal portion 255 of the metal film 25 (stacked higher) has a greater extension length W2 than the extension length W1 of the distal portion 235 of the metal film 23 (stacked lower). However, it will be appreciated that many variations and modifications can be made to embodiments of the disclosure. In some embodiments, the metal film stacked higher has shorter distal portion. For example, in the embodiment shown in FIG. 2, an extension length W3 of the distal portion 275 is shorter than both the extension lengths W1 and W2 of the distal portions 235 and 255 in the direction D1.

In some embodiments, at least two of the spacer structures 31, 32 and 33 have different sizes. For example, as shown in FIG. 2, the spacer structure 32 located adjacent to the distal portion 255 of the metal film 25 has a larger size than the spacer structure 31 located adjacent to the distal portion 235 of the metal film 23. However, it will be appreciated that many variations and modifications can be made to embodiments of the disclosure. In some embodiments, the spacer structure stacked higher has smaller size. For example, in the embodiment shown in FIG. 2, the spacer structure 33 is smaller than both the spacer structures 31 and 32.

In some embodiments, structural features of the trenches 15 and 17 are similar to those of the structure features of trench 13 the description is abbreviated for the sake of brevity.

Referring FIG. 1, the contacts 14, 16 and 18 are respectively formed in the trenches 13, 15 and 17 and electrically connected to base metal film 212 and the metal films 23, 25 and 27 for the electrical connection. In some embodiments, the contacts 14, 16 and 18 are conformally formed in the trenches 13, 15 and 17. The contacts 14, 16 and 18 are in direct contact with the slopped side walls of respective trenches 13, 15 and 17 and are in direct contact with the spacer structures 31, 32 and 33 (FIG. 2).

With reference to FIGS. 3-13, a series of cross-sectional views illustrate some embodiments of a method for forming a MEMS device. The method may, for example, be employed to form the MEMS device 10 in FIG. 1. While the cross-sectional views shown in FIGS. 3-13 are described with reference to the method, it will be appreciated that the structures shown in FIGS. 3-13 are not limited to the method and may stand alone without the method. In the present exemplary embodiments, similar processes are also conducted in the MEMS device 10 to form the contacts 16 and 18, and therefore the processes for forming the contacts 16 and 18 are omitted for purpose of brevity.

In the following descriptions, for the purpose of illustration, the piezoelectric film 22 is referred to as first piezoelectric film, the piezoelectric film 24 is referred to as second piezoelectric film, the piezoelectric film 26 is referred to as third piezoelectric film. In addition, the metal film 23 is referred to as first metal film, the metal film 25 is referred to as second metal film, and the metal film 27 is referred to as third metal film.

Figure 3:
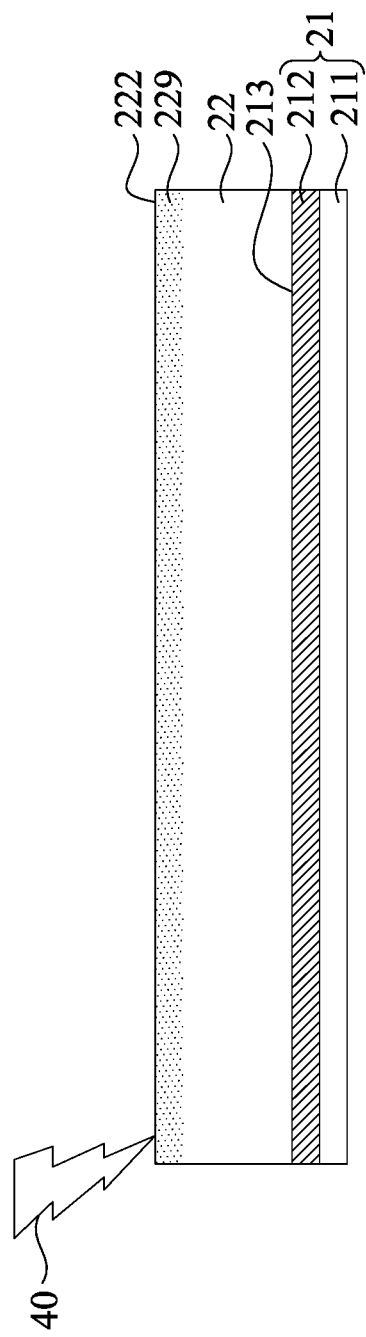
FIGS. 3-10 are cross-sectional views of a MEMS device in various stages of a manufacturing method, in accordance with some embodiments of the present disclosure.

As illustrated by the cross-sectional view of FIG. 3, the first piezoelectric film 22 is formed on the base layer 21. The first piezoelectric film 22 may be or comprise, for example, aluminium nitride (AlN) films and the like and has a thickness that is in a range from about 0.3 micrometers to about 0.7 micrometers. The first piezoelectric film 22 may, for example, be formed by chemical vapor deposition (CVD), physical vapor deposition (PVD) or the like.

In some embodiments, a plasma treatment 40 is performed after the formation of the first piezoelectric film 22. The plasma treatment 40 may include Ar plasma treatment to enhance piezo-efficiency by decrease AlN roughness. In some embodiments, after the plasma treatment 40, AlN crystal damage occurs thereby causing a change in crystal structure in a top portion of the first piezoelectric film 22 that is immediately adjacent to a top surface 222 of the first piezoelectric film 22. In some embodiments, the top portion 229 of the first piezoelectric film 22 becomes amorphous structure after the plasma treatment. The change in crystal structure may demonstrate different etching rate from that of the other region of the first piezoelectric film 22.

Figure 4:
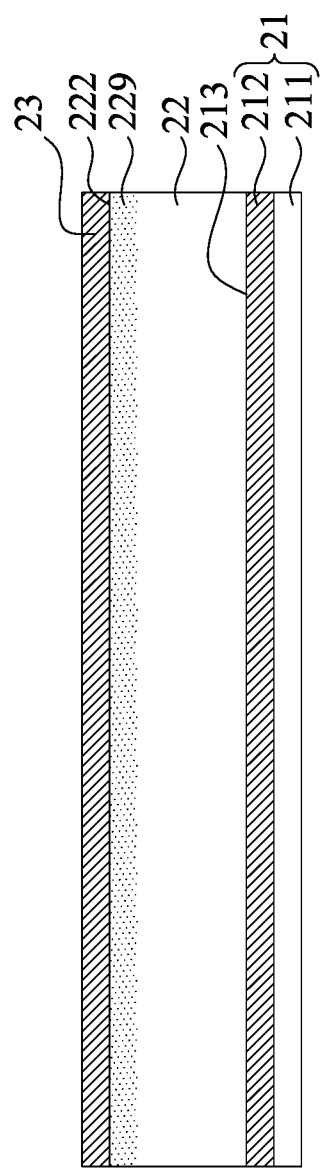

As illustrated by the cross-sectional view of FIG. 4, the first metal film 23 is formed on the top surface 222 of the first piezoelectric film 22. The first metal film 23 may be or comprise, for example, molybdenum (Mo) and the like and has a thickness that is in a range from about 100 Å to about 500 Å. The first metal film 23 is formed using suitable deposition techniques, such as atomic layer deposition (ALD), chemical vapor deposition (CVD), physical vapor deposition (PVD) or the like.

Figure 5:
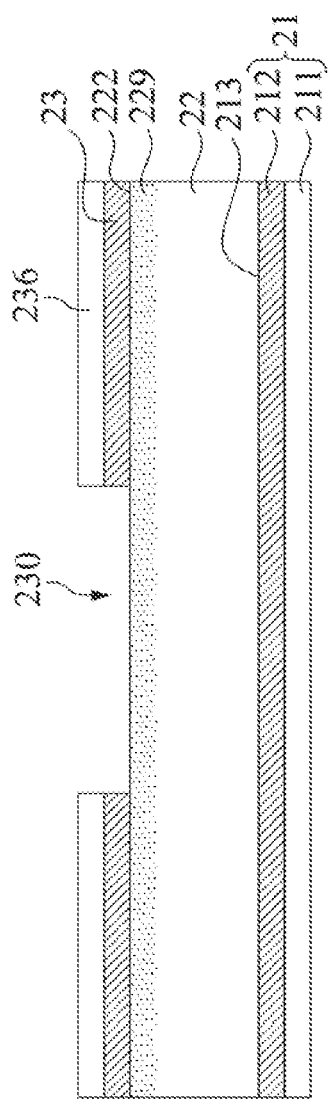

As illustrated by the cross-sectional view of FIG. 5, the first metal film 23 is patterned using suitable photolithography techniques to form an opening 230. In some embodiments, the patterning is performed by an etching process, some other suitable patterning process(es), or any combination of the foregoing. In some embodiments, the etching process comprises forming a mask 236 on the first metal film 23, performing an etch into the first metal film 23 with the mask 236 in place, and removing the mask 236 after the etch. The mask 236 may, for example, be or comprise photoresist, silicon nitride, some other suitable mask material(s), or any combination of the foregoing.

Figure 6:
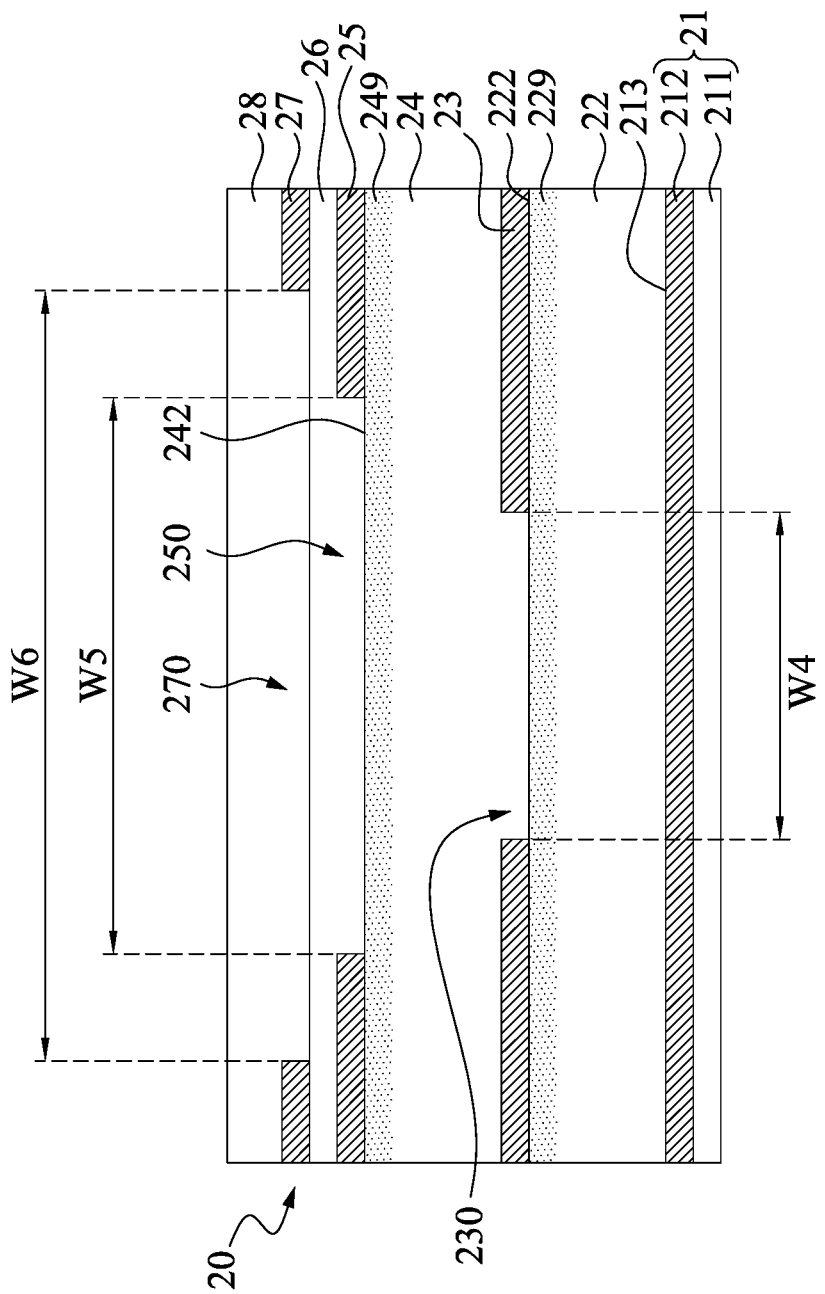

As illustrated by the cross-sectional view of FIG. 6, the second piezoelectric film 24, the second metal film 25, the third piezoelectric film 26 and the third metal film 27 are formed sequentially over the patterned first metal film 23 by the similar process forming the first piezoelectric film 22 and the first metal film 23, and the formation of the flexible layer 20 is completed. In some embodiments, the thickness of the second piezoelectric film 24 is in a range from about 0.3 micrometers to about 0.7 micrometers, the thickness of the third piezoelectric film 26 is in a range from about 100 Å to about 500 Å, and the thickness of the second metal film 25 and the thickness of the third metal film 27 is in a range from about 100 Å to about 500 Å.

In some embodiments, a protection film 28 is formed over the last metal film of the flexible layer 20, such as metal film 27. The second piezoelectric film 24 and the third piezoelectric film 26 may be or include aluminium nitride (AlN) films and the like. The second metal film 25 and the third metal film 27 may be or include molybdenum (Mo) and the like. The protection film 28 may be or include an oxide layer, e.g., thermal or chemical oxide having a thickness ranging from about 0.5 micrometers to about 1 micrometer. In some embodiments, amorphous structure is formed on a top portion 249 of the second piezoelectric film 24 by plasma treatment before the formation of the metal film 25.

In some embodiments, as shown in FIG. 6, an opening 250 is formed in the second metal film 25, and an opening 270 is formed in the third metal film 27 using suitable photolithography techniques. The opening 250 and the opening 270 are arranged centrally aligned the opening 230 of the first metal film 23. In some embodiments, the metal layer stacked higher has an opening with a greater width than the opening formed in the metal layer which is stacked lower. For example, a width W4 of the opening 230 is smaller than a width W5 of the opening 250, and a width W5 of the opening 250 is smaller than a width W6 of the opening 260. The variation of the width of the openings depends on the shape of the trench formed in the flexible layer 20 in the following process shown in FIG. 7A.

Figure 7A:
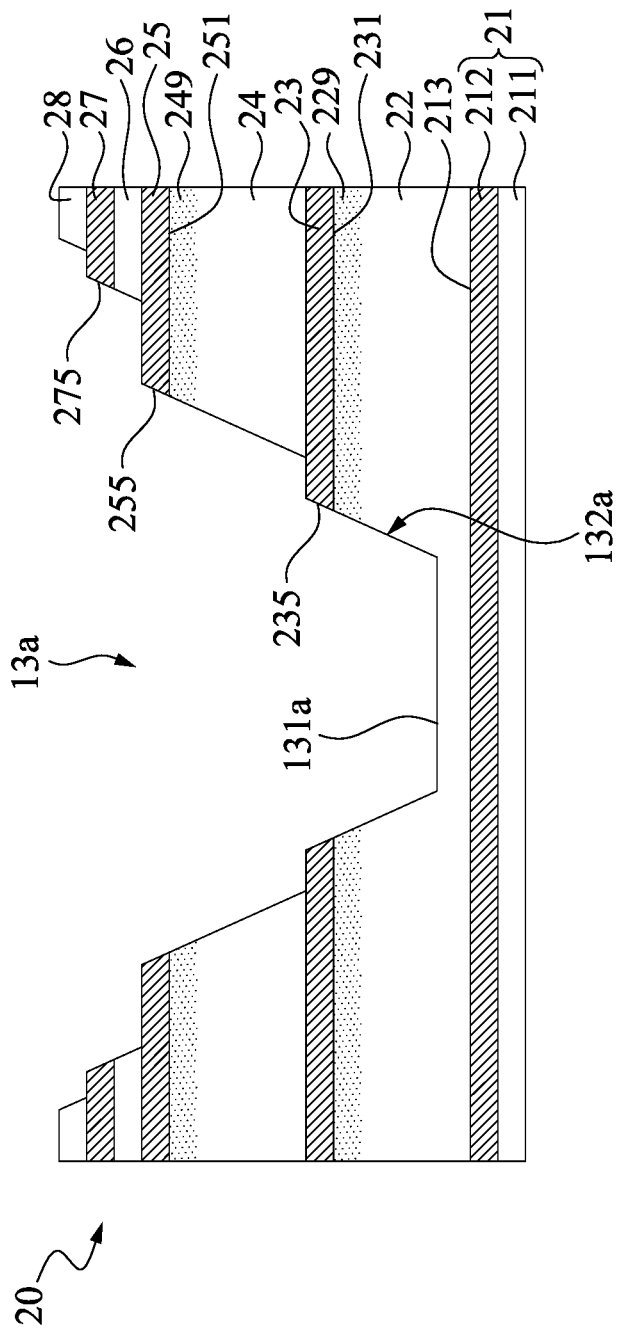

As illustrated by the cross-sectional view of FIG. 7A, the flexible layer 20 is etched back to form a first trench 13a via dry etching process with the metal films 23, 25 and 27 served as masks. In some embodiments, the via dry etching process may be conducted with the use of $Cl_2$ gas or $SF_6$ gas and is well controlled so that a portion of the lowest piezoelectric film that is immediately adjacent to the base layer 21 is remained. Specifically, as illustrated in the embodiment shown in FIG. 7A, the etch may extend into the upper surface of the first piezoelectric film 22, for example ranging from 50% to approximately 80% into the depth of the first piezoelectric film 22 in some embodiments. The bottom wall 131a of the first trench 13a is distant from the top surface 213 of the base layer 21. The portion of the first piezoelectric film 22 under the bottom wall 131a of the first trench 13a may protect the base metal film 212 from being damaged during the formation of the spacer structures in the following process so as to exhibit a stable electrode resistance of the base metal film 212.

Figure 7B:
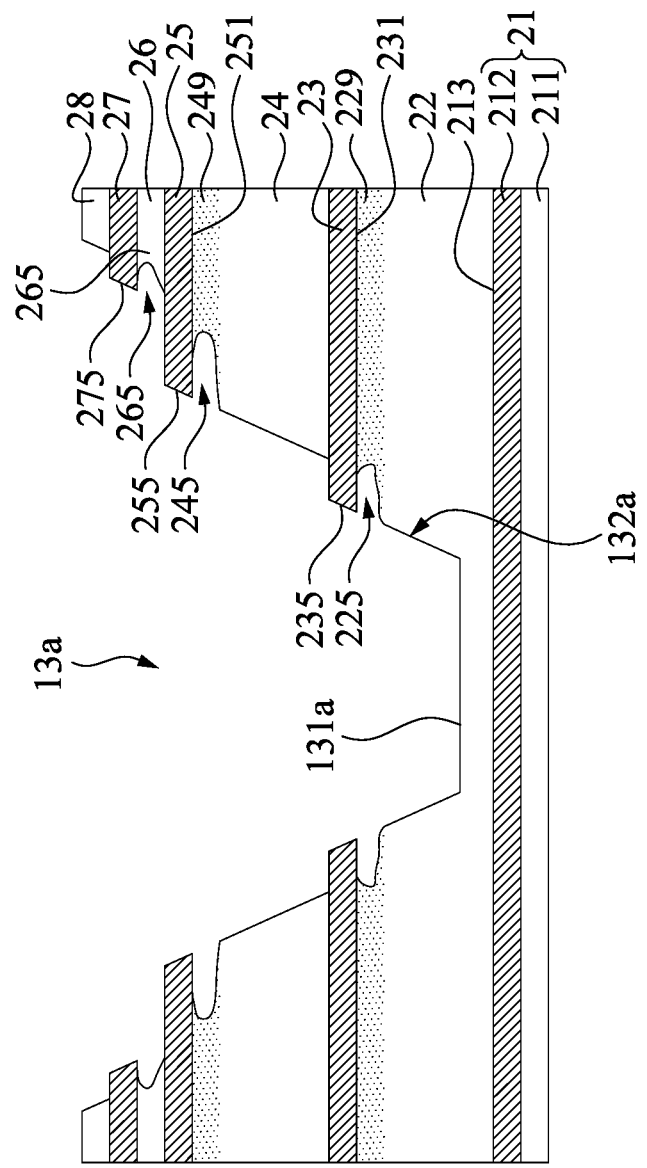

As illustrated by the cross-sectional view of FIG. 7B, voids 225, 245 and 265 are formed on the side wall 132a of the first trench 13a. In some embodiments, the bottom wall 131a and the side wall 132a of the first trench 13a is further etched by wet etching process. In some embodiments, at least one of the piezoelectric films 22, 24 and 26 is processed with the plasma treatment which makes the top portions 229, 249, 269 of the piezoelectric films 22, 24 and 26 has a higher etching rate than the other portion of the piezoelectric films 22, 24 and 26. As a result, the wet etching process removes lateral portions of the top portions 229, 249, and 269 of the piezoelectric films 22, 24 and 26, thereby leaving voids 225, 245 and 265 on the top portions 229 and 249. The voids 225, 245 and 265 exposed a portion of the bottom surfaces of the metal films 23, 25 and 27 relative to the distal portions 235, 255 and 275. In other words, the distal portions 235, 255 and 275 of the metal films 23, 25 and 27 is not supported by the underlying piezoelectric films 22, 24 and 26. However, it will be appreciated that many variations and modifications can be made to embodiments of the disclosure. In some embodiments, the piezoelectric films 26 is not processed with the plasma treatment, and the void 265 is not formed, the side wall of the first trench 13a corresponding to the third piezoelectric film is a flat surface.

In some embodiments, the remaining portion of the first piezoelectric film 22 under the bottom wall 131a of the first trench 13a become thinner after the wet etching in comparison with the piezoelectric film 22 shown in FIG. 7A, but the wet etching process is controlled such that the underlying base metal film 212 is not exposed by the first trench 13a. The wet etching process may be performed by using $H_3PO_4$ solution having concentration of 80-85 wt % at a temperature in a range from about 120° C. to about 140° C. for about 10 seconds to about 80 seconds.

In some embodiments, the formation of the voids causes a portion of the metal films not being supported by the underlying piezoelectric film and leads to a bending of the distal portions of the metal films. The bending of the metal films may cause a structure damage of the contact formed in the trench, thereby severely affecting stability of the MEMS devices 10. To address this problem, spacer structures are filled in the voids to support the metal films.

Figure 8:
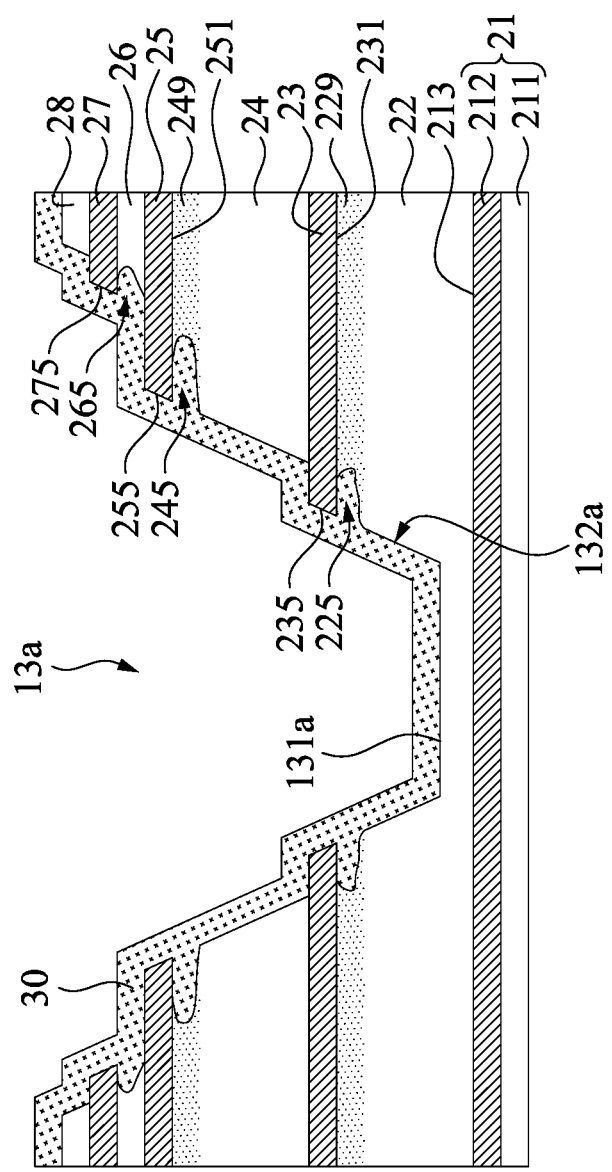

Specifically, as illustrated by the cross-sectional view of FIG. 8, a spacer material 30 is formed in the first trench 13a. The spacer material 30 covers the bottom wall 131a and the side wall 132a of the first trench 13a. The spacer material 30 is formed using suitable deposition techniques, such as atomic layer deposition (ALD), chemical vapor deposition (CVD), physical vapor deposition (PVD) or the like. The spacer material 30 may be or include thermal oxide or TEOS oxide and has a thickness of about 500 Å to about 2000 Å. In some embodiments, since the spacer material 30 has a good gap filling property such that the voids 225, 245 and 265 are filled by the spacer material 30.

Figure 9:
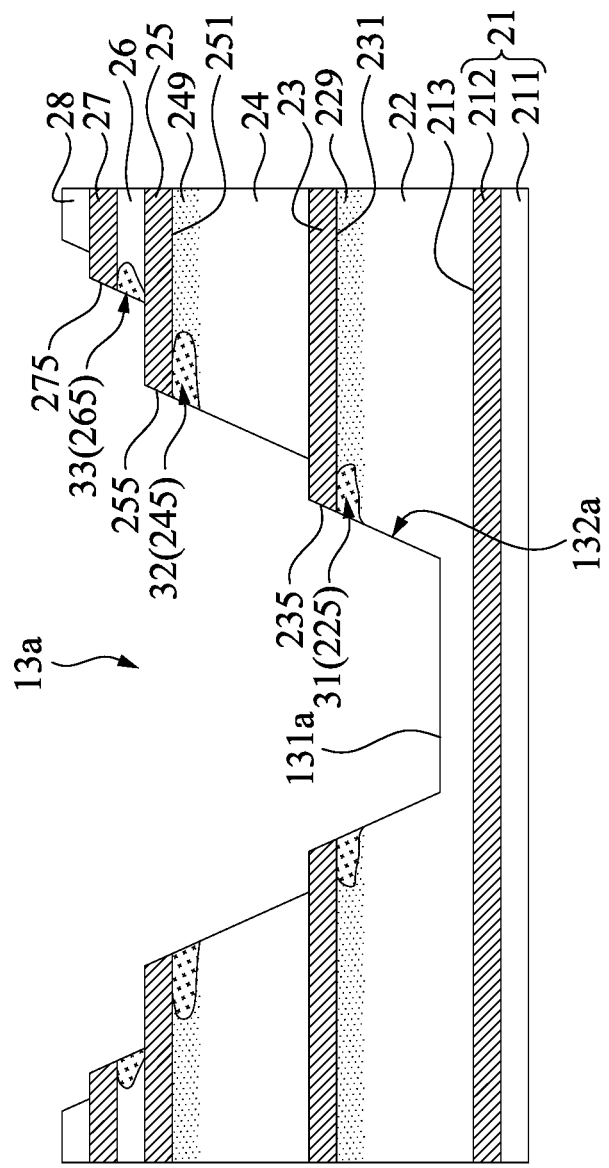

As illustrated by the cross-sectional view of FIG. 9, the spacer material 30 on the bottom wall 131a and the side wall 132a of the first trench 13a is removed by an etching process. The etching process is controlled such that the spacer material 30 on the bottom wall 131a and the side wall 132a of the first trench 13a is removed, but the spacer material 30 filled in the voids 225, 245 and 265 is remained. The spacer material 30 remained in the voids 225, 245 and 265 are referred to as the spacer structures 31, 32 and 33 in the following descriptions. In addition, etching process is controlled such that the first trench 13a does not pass through a portion of the first piezoelectric film 22 under the bottom wall 131a, and the base metal film 212 is not exposed by the first trench 13a.

In some embodiments, the voids 245 formed in the second piezoelectric film 24 (piezoelectric film stacked higher) has a larger size than the void 225 formed in the first piezoelectric film 22 (piezoelectric film stacked lower), and the spacer material entirely filled the voids 225 and 245. As a result, the spacer structures 31 and 32 have different sizes and extension lengths. In some embodiments, the size of the spacer structure 32 is larger than the size of the spacer structure 31. In some embodiments, the extension length W2 (FIG. 2) of the spacer structure 32 is greater than the extension length W1 of the spacer structure 31. In one exemplary embodiment, the extension length W2 of the spacer structure 32 is of about 100 nm to about 500 nm, for example, 318 nm, and the extension length W1 of the spacer structure 31 is of about 100 nm to about 500 nm, for example, 204 nm. In the cases wherein the void 265 is not formed, the spacer structure 33 is omitted. In some embodiments, while the void 265 is not formed, the side wall of the first trench 13a corresponding to the third piezoelectric film 26 is rough, and thus minor unevenness may be formed thereon. The minor unevenness may be filled by the spacer material 30 after the removal of the spacer material 30.

Figure 10:
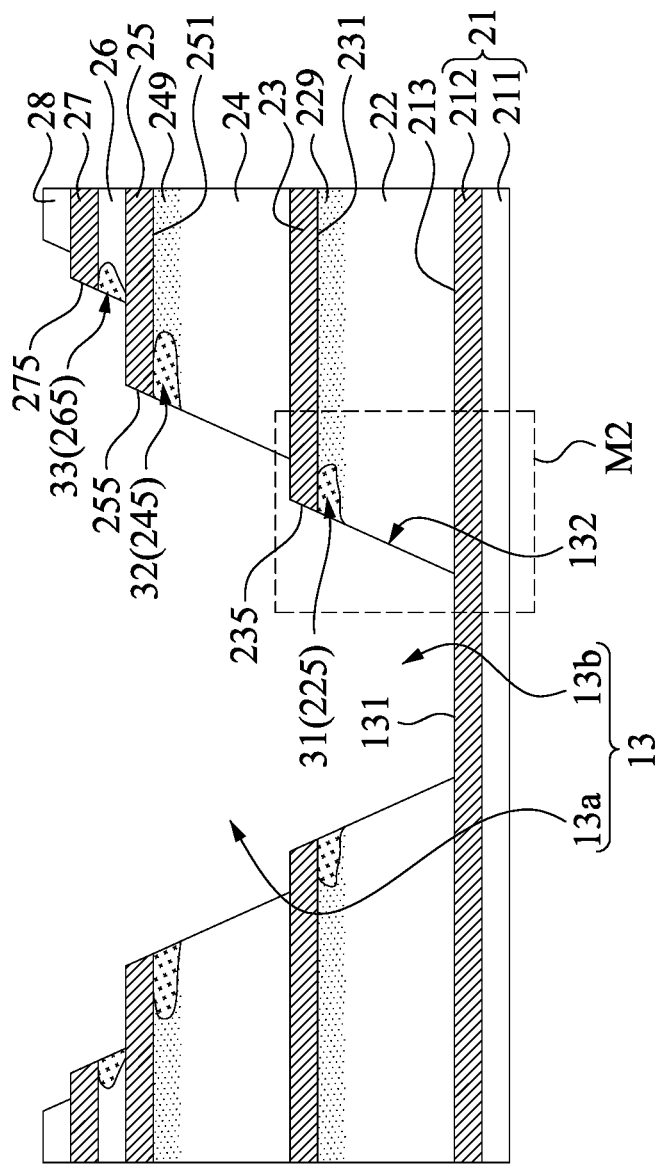

As illustrated by the cross-sectional view of FIG. 10, a second trench 13b is formed underlying the first trench 13a by performing another wet etching process. The wet etching process for forming the second trench 13b is controlled such that the second trench 13b passes through the first piezoelectric film 22 to expose the base metal film 212. The wet etching process may be performed by using $H_3PO_4$ solution having concentration of 80-85 wt % at a temperature in a range from about 120° C. to about 140° C. for about 30 seconds to about 150 seconds. The wet etching process for forming the second trench 13b may be performed for a longer time than the wet etching process for forming the voids 225, 245 and 265. The first trench 13a communicates with the second trench 13b and collectively referred to as trench 13.

Figure 11:
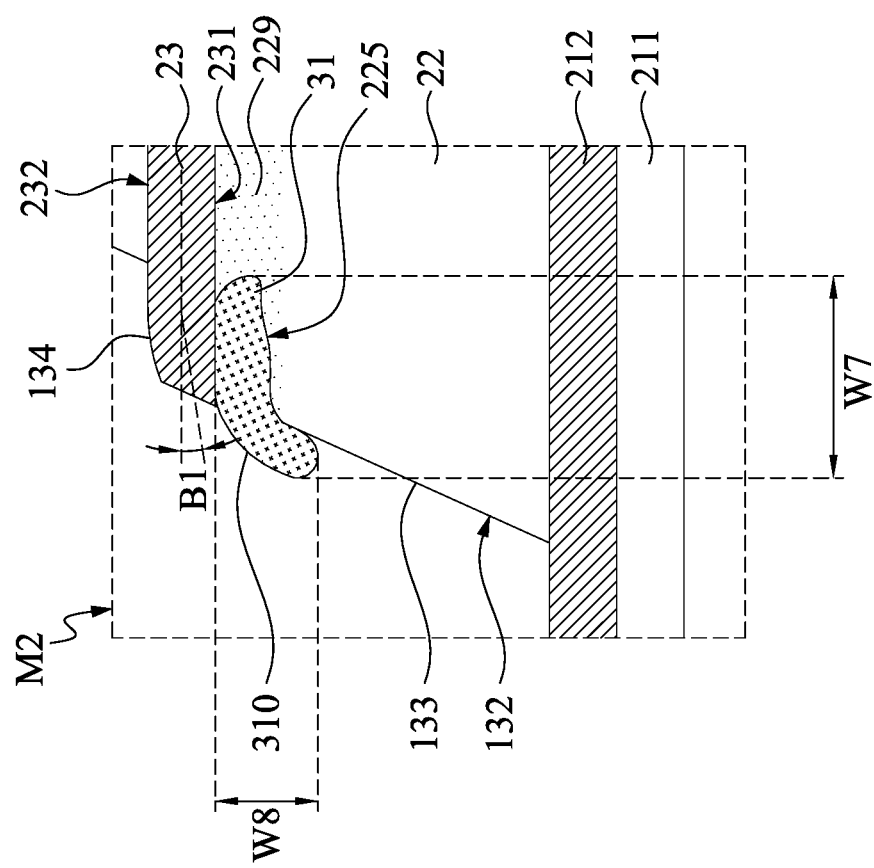
FIG. 11 is a magnified cross-sectional view of an area M2 of the MEMS device shown in FIG. 10, in accordance with some embodiments of the present disclosure.

In some embodiments, a surface of at least one of the spacer structures 31, 32 and 33 that is adjacent to the slopped side wall 132 of the trench 13 is protruded from the slopped side wall 132. For example, as shown in FIG. 11, a surface 310 of the spacer structure 31 exposed by the first piezoelectric film 22 is protruded from the first slopped segment 133 of the slopped side wall 132. In some embodiments, at least a portion of the slopped side wall 132 that is located adjacent to the voids 225 and 245 is covered by the spacer structures. For example, as shown in FIG. 11, a portion of the first slopped segment 133 of the slopped side wall 132 that is located adjacent to the void 225 is covered by the spacer structures 31. In some embodiments, a width W7 and a height W8 of the spacer structure 31 are in a range from about 500 angstroms to about 2000 angstroms.

In some embodiments, as shown in FIG. 7B, since the distal portions 235 and 255 exposed by the voids 225 and 245 are not supported by the underlying piezoelectric film 22 and 24 before the formation of the spacer structures 31 and 32 in the voids 225 and 245, the distal portions 235 and 255 may become deformed. For example, as shown in FIG. 11, the distal portion 235 of the metal film 23 is slightly bent downward, and the bend angle B1 may be smaller than 5 degrees.

Figure 12:
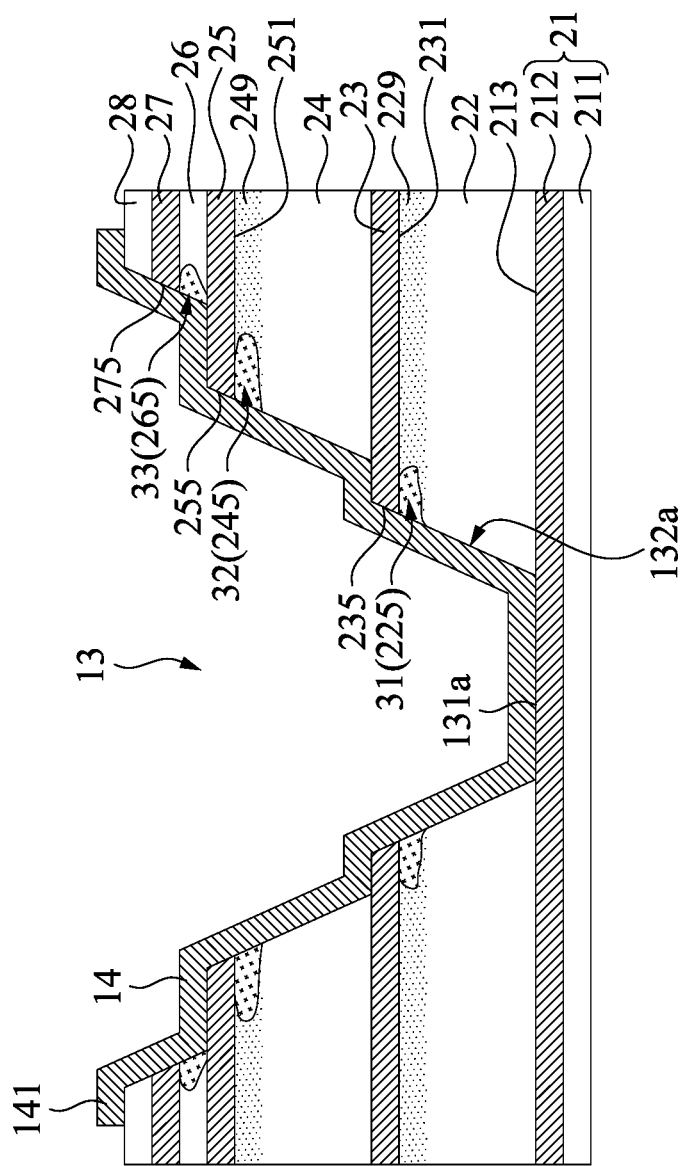
FIGS. 12 and 13 are cross-sectional views of a MEMS device in various stages of a manufacturing method, in accordance with some embodiments of the present disclosure.

As illustrated by the cross-sectional view of FIG. 12, the contact 14 is formed in the trench 13. In some embodiments, since the voids 225, 245 and 265 underlying the metal films 23, 25 and 27 are filled with the spacer structures 31, 32 and 33, the contact 14 is conformally formed in the trench 13. That is, the contact 14 extends along the first slopped segment 133, the first connecting segment 134, the second slopped segment 135, the second connecting segment 136, the third slopped segment 137 and the third connecting segment 138. As a result, damages to the contact 14 due to the deformation of the metal films 23, 25 and 27 can be prevented, and the stability of the MEMS device 10 is improved. The contact 14 may be or comprise, for example, aluminium bronze (AlCu) films and has a thickness that is in a range from about 0.5 micrometers to about 1 micrometer.

Figure 13:
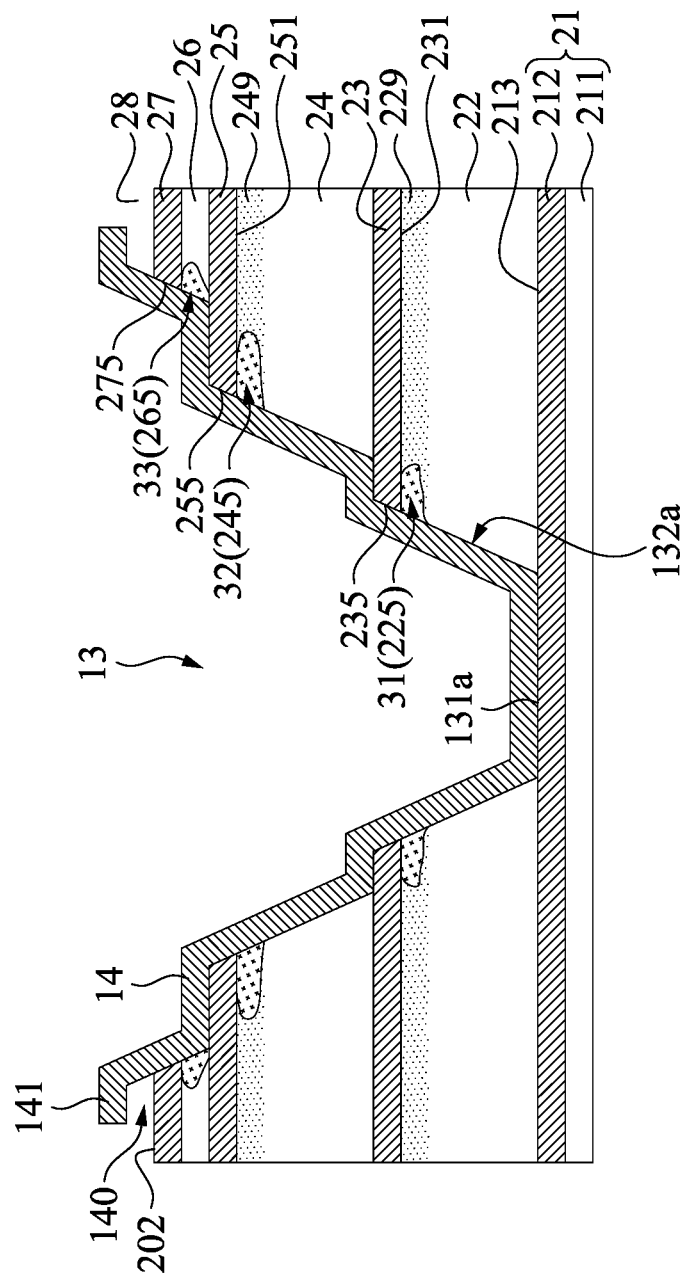

As illustrated by the cross-sectional view of FIG. 13, the protection film 28 is removed. The protection film 28 may be removed by conducting an etching process. After the removal of the protection film 28, an end portion 141 of the contact 14 is spaced from the top surface 202 of the flexible layer 20. In one exemplary embodiment, the end portion 141 is distant from the top surface 202 of the flexible layer 20 by a distance of about 0.5 micrometers to about 1 micrometer.

Figure 14:
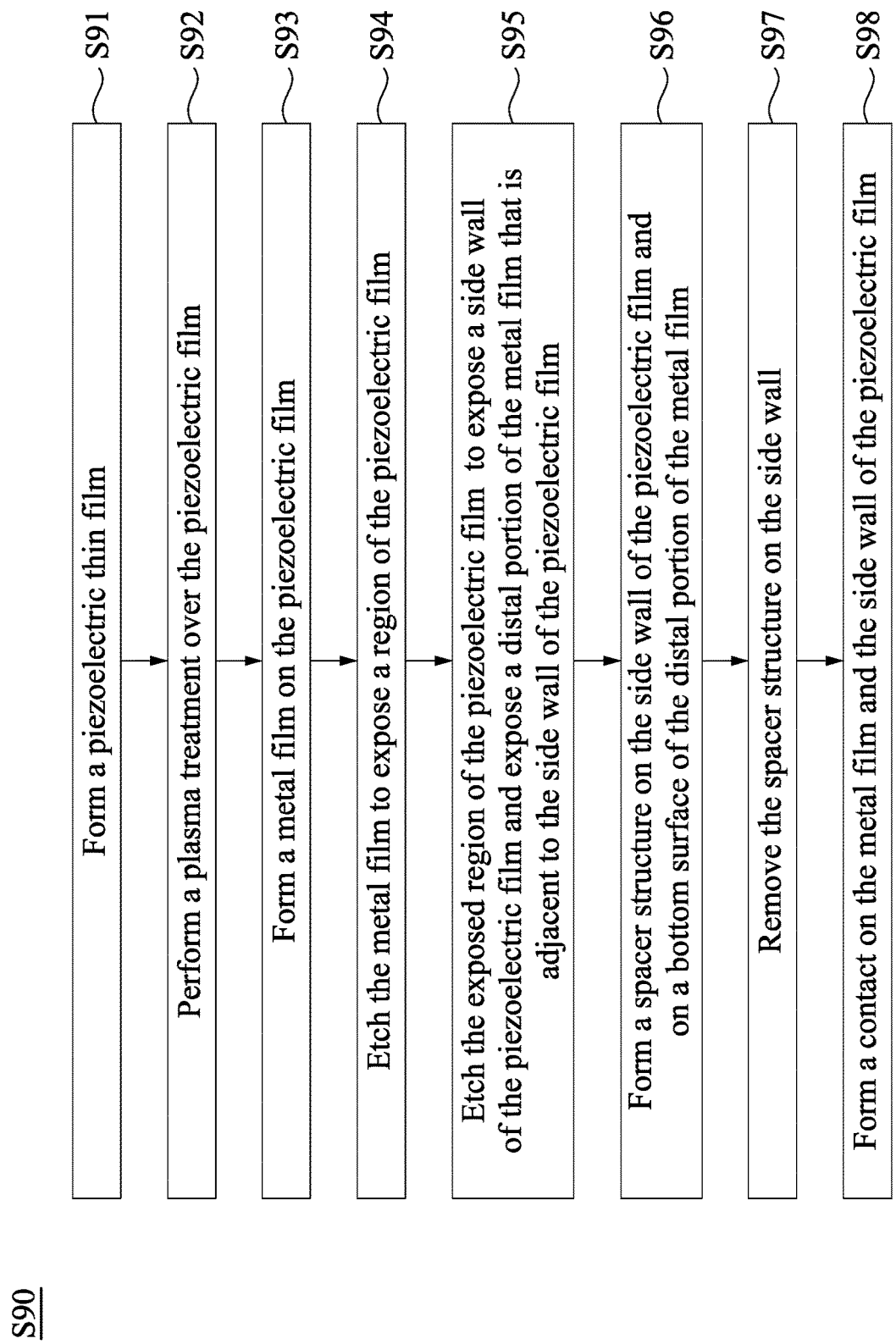
FIG. 14 is a flow chart of a method of manufacturing a MEMS device, in accordance with some embodiments of the present disclosure.

FIG. 14 illustrates a method of manufacturing the MEMS device 10 in flowchart format S90 in accordance with some embodiments.

At operation S91, a piezoelectric film is formed on a base layer. In some embodiments, this act can be consistent with all or portions of FIG. 3, for example.

At operation S92, a plasma treatment is performed over the piezoelectric film. In some embodiments, this act can be consistent with all or portions of FIG. 4, for example.

At operation S93, a metal film is formed on the piezoelectric film. In some embodiments, this act can be consistent with all or portions of FIG. 5, for example.

At operation S94, the metal film is etched to expose a region of the piezoelectric film. In some embodiments, this act can be consistent with all or portions of FIG. 5, for example.

At operation S95, the exposed region of the piezoelectric film is etched to expose a side wall of the piezoelectric film and expose a distal portion of the metal film that is adjacent to the side wall of the piezoelectric film. In some embodiments, this act can be consistent with all or portions of FIGS. 7A and 7B, for example.

At operation S96, a spacer material is formed on the side wall of the piezoelectric film and formed on a bottom surface of the distal portion of the metal film. In some embodiments, this act can be consistent with all or portions of FIG. 8, for example.

At operation S97, the spacer material on the side wall of the piezoelectric film is removed. In some embodiments, this act can be consistent with all or portions of FIG. 9, for example.

At operation S98, a contact is formed on the metal film and the side wall of the piezoelectric film. In some embodiments, this act can be consistent with all or portions of FIG. 12, for example.

Embodiments of the present disclosure conduct a plasma treatment over the piezoelectric film during a manufacturing process of a MEMS device. Since the roughness of the piezoelectric film is improved, a piezo-efficiency of the MEMS device is enhanced. While voids may be formed on the piezoelectric film due to the crystal damage resulting from the plasma treatment, these voids are filled with spacer structures. Therefore, contact can be conformally formed in the trench of the piezoelectric film, and a line broken issue of the contact is avoided thereby improving wafer acceptable test (WAT).

In accordance with some embodiments, a method for forming a MEMS device is provided. The method includes forming a stack of piezoelectric films and metal films on a base layer, wherein the piezoelectric films and the metal films are arranged in an alternating manner. The method also includes etching a first trench in the stack of the piezoelectric films and the metal films. The method further includes forming at least one void at the side wall of the first trench. In addition, the method includes forming a spacer structure in the at least one void. The method further includes forming a contact in the first trench after the formation of the spacer structure.

In accordance with some embodiments, a method for forming a MEMS device is provided. The method includes depositing a first piezoelectric film on a base layer and forming amorphous structures in a first top portion of the first piezoelectric film. The method also includes forming a first metal film on the first top portion of the first piezoelectric film and patterning the first metal film to expose the first top portion of the first piezoelectric film. The method further includes etching a first trench in the first piezoelectric film. In addition, the method includes forming a first void at the side wall of the first trench, wherein the first void is located at the first top portion and forming a spacer structure in the first void. The method further includes forming a contact in the first trench.

In accordance with some embodiments, a MEMS device is provided. The MEMS device includes a base layer and a stack of piezoelectric films and metal films formed on the base layer. The piezoelectric films and the metal films being arranged in an alternating manner. Each of the metal films includes a distal portion located adjacent to a side wall of the stack of the piezoelectric films, and at least one of the distal portions of the metal films is free from contact with the piezoelectric film. The MEMS device also includes a spacer structure formed adjacent to the at least one of the distal portions that is free from contact with the piezoelectric film. The MEMS device further includes a contact covering the side wall of the stack of the piezoelectric films and the metal films and covering a portion of the base layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a microelectromechanical systems (MEMS) device, comprising:
    forming a stack of piezoelectric films and metal films on a base layer, wherein the piezoelectric films and the metal films are arranged in an alternating manner;
    etching a first trench in the stack of the piezoelectric films and the metal films;
    forming at least one void at a side wall of the first trench;
    forming a spacer structure in the at least one void; and
    forming a contact in the first trench after the formation of the spacer structure.

2. The method of claim 1, wherein forming the at least one void is performed such that the voids are located at a top portion of at least one of the piezoelectric films on which one of the metal films is formed.

3. The method of claim 2, further comprising:
    performing a plasma process over a top surface of the at least one of the piezoelectric films,
    wherein the plasma process is performed before forming one of the metal films on the top surface of the at least one of the piezoelectric films.

4. The method of claim 1, wherein forming the first trench in the stack of the piezoelectric films and the metal films is performed such that a first void is formed at a first one of the piezoelectric films and a second void is formed at a second one of the piezoelectric films, and the spacer structure is filled in both the first void and the second void;
    wherein the second one of the piezoelectric films is higher than the first one of the piezoelectric films, and the spacer structure in the second void has a greater size than the spacer structure in the first void.

5. The method of claim 1, wherein forming the first trench in the stack of the piezoelectric films and the metal films is performed such that a first void is formed at a first one of the piezoelectric films and a second void is formed at a second one of the piezoelectric films;
    wherein the first void exposes a distal portion of a first one of the metal films, the first one of the metal films is formed on the first one of the piezoelectric films, and the second void exposes a distal portion of a second one of the metal films, the second one of the metal films is formed on the second one of the piezoelectric films;
    wherein the distal portion of the first one of the metal films exposed by the first void has a greater length than a length of the distal portion of the second one of the metal films exposed by the second void.

6. The method of claim 1, wherein the formation of the spacer structure in the void comprises:
    forming a film of the spacer structure on the side wall of the first trench, wherein the at least one void at the side wall of the first trench is filled with the spacer structure; and
    removing the film of the spacer structure on the side wall of the first trench but remaining the spacer structure in the at least one void at the side wall of the first trench.

7. The method of claim 1, wherein the first trench does not go through the stack of the piezoelectric films and the metal films, and the method further comprises:
    forming a second trench underlying the first trench to expose the base layer,
    wherein the contact covers the side wall of the first trench, a side wall of the second trench and a region of the base layer that is exposed by the second trench.

8. The method of claim 1, further comprising preparing the base layer by forming a base metal film on a base piezoelectric film, wherein the stack of the piezoelectric films and the metal films is formed on the base metal film.

9. A method for forming a microelectromechanical systems (MEMS) device, comprising:
    depositing a first piezoelectric film on a base layer;
    forming amorphous structures in a first top portion of the first piezoelectric film;
    forming a first metal film on the first top portion of the first piezoelectric film;
    patterning the first metal film to expose the first top portion of the first piezoelectric film;
    etching a first trench in the first piezoelectric film;
    forming a first void at a side wall of the first trench, wherein the first void is located at the first top portion;
    forming a spacer structure in the first void; and
    forming a contact in the first trench.

10. The method of claim 9, wherein the first trench is formed by conducting a dry etching process, and the first void is formed by conducting a wet etching process.

11. The method of claim 9, wherein the amorphous structures in the first top portion of the first piezoelectric film are formed by performing a plasma process over the first piezoelectric film;
    wherein the plasma process is performed before forming the first metal film.

12. The method of claim 9, further comprising:
    forming a second piezoelectric film on the first metal film;
    forming amorphous structures in a second top portion of the second piezoelectric film;
    forming a second metal film on the second top portion of the second piezoelectric film;
    patterning the second metal film to exposed the second top portion of the second piezoelectric film, wherein the first trench is formed in both the first piezoelectric film and the second piezoelectric film, and a second void is located at the second top portion; and
    forming the spacer structure in the second void.

13. The method of claim 12, wherein the spacer structure in the second void at the second piezoelectric film has a greater size than the size of the spacer structure in the first void at the first film.

14. The method of claim 12, wherein the first void exposes a distal portion of the first metal film, and the second void exposes a distal portion of the second metal film, the distal portion of the first metal film exposed by the first void has a greater length than a length of the distal portion of the second metal film exposed by the second void.

15. The method of claim 9, wherein the first trench does not go through the first piezoelectric film, and the method further comprises:

forming a second trench underlying the first trench to expose the base layer, wherein the contact covers the side wall of the first trench, a side wall of the second trench and a region of the base layer that is exposed by the second trench.

16. A microelectromechanical systems (MEMS) device, comprising:

a base layer;

a stack of piezoelectric films and metal films formed on the base layer with the piezoelectric films and the metal films being arranged in an alternating manner, wherein each of the metal films comprises a distal portion located adjacent to a side wall of the stack of the piezoelectric films, and at least one of the distal portions of the metal films is free from contact with the piezoelectric film;

a spacer structure formed adjacent to the at least one of the distal portions that is free from contact with the piezoelectric film; and a contact covering the side wall of the stack of the piezoelectric films and the metal films and covering a portion of the base layer.

17. The MEMS device of claim 16, wherein a length of the spacer structure is in a range from about 500 angstroms to about 2000 angstroms.

18. The MEMS device of claim 16, wherein more than two of the distal portions of the metal films are free from contact with the piezoelectric film, and the spacer structure located adjacent to the distal portion of one of the metal films that is stacked higher has a greater extension length than the spacer structure located adjacent to the distal portion of one of the metal films that is stacked lower.

19. The MEMS device of claim 16, wherein more than two of the distal portions of the metal films are free from contact with the piezoelectric film, and the spacer structure formed adjacent to each of the distal portions that are free from contact with the piezoelectric film;

wherein the distal portion of one of the metal films that is stacked higher is covered with the spacer structure having larger size than the distal portion of another one of the metal films that is stacked lower.

20. The MEMS device of claim 16, wherein the distal portion of the at least one of the metal films is bent downward.

* * * * *